US006979369B2

(12) United States Patent
Yamaguchi et al.

(10) Patent No.: US 6,979,369 B2
(45) Date of Patent: Dec. 27, 2005

(54) FIXING STRUCTURES AND SUPPORTING STRUCTURES OF CERAMIC SUSCEPTORS, AND SUPPORTING MEMBERS THEREOF

(75) Inventors: Kazuaki Yamaguchi, Ama (JP); Yoshinobu Goto, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 190 days.

(21) Appl. No.: 10/393,108

(22) Filed: Mar. 20, 2003

(65) Prior Publication Data
US 2003/0183341 A1 Oct. 2, 2003

(30) Foreign Application Priority Data
Mar. 28, 2002 (JP) .............................. 2002-090330

(51) Int. Cl.[7] .......................... H01L 21/00; C23C 16/00
(52) U.S. Cl. ...................... 118/725; 118/728; 118/500; 156/345.52; 156/345.51; 219/444.1; 279/128; 361/234; 392/416; 392/418
(58) Field of Search ...................... 118/725, 728, 500; 156/345.51, 345.52, 345.53; 219/444.1; 392/416, 392/418; 279/128; 361/234

(56) References Cited

U.S. PATENT DOCUMENTS

| 6,160,244 A | * | 12/2000 | Ohashi ...................... 219/444.1 |
| 6,261,708 B1 | | 7/2001 | Ohashi et al. |
| 2002/0144787 A1 | | 10/2002 | Yamaguchi |

FOREIGN PATENT DOCUMENTS

JP          2001-250858 A      9/2001

* cited by examiner

Primary Examiner—Ram N Kackar
(74) Attorney, Agent, or Firm—Burr & Brown

(57) ABSTRACT

A supporting structure of a ceramic susceptor is provided, including a ceramic susceptor to be heated having a mounting face and a back face, and a ceramic supporting member joined with the back face of the susceptor. The supporting member has an outer wall surface, and a continuous and integral curved part formed between the outer wall surface and the back face of the susceptor. The curved part has a radius of curvature "R" in a range of 4 mm to 25 mm in the longitudinal direction of the supporting member, and a minimum wall thickness "t" in a range of 1 mm to 15 mm.

13 Claims, 6 Drawing Sheets

FIXING STRUCTURES AND SUPPORTING STRUCTURES OF CERAMIC SUSCEPTORS, AND SUPPORTING MEMBERS THEREOF

This application claims the benefit of Japanese Patent Application P2002-90330 filed on Mar. 28, 2002, the entirety of which is incorporated by reference.

BACKGROUND OF THE INVENTION

1. Field of the Invention

The present invention relates to a fixing structure of a ceramic susceptor to a chamber, a supporting structure of a ceramic susceptor and a supporting member for the same.

2. Related Art Statement

In a system for producing semiconductors, it is necessary to fix a ceramic susceptor made of, for example, aluminum nitride to the inner wall surface of a chamber. For this, one end of a tubular supporting member made of a ceramics is fixed to a joining face of a ceramic heater and the other end is fixed to the inner wall surface of a chamber. The supporting member is composed of a ceramic plate made of a heat resistant ceramics such as alumina and aluminum nitride. The supporting member and chamber are sealed with an O-ring to secure the air-tightness. It is thus possible to seal the inner space of the supporting member with respect to the inner space of the chamber to secure air-tightness and thereby to prevent the leakage of a gas in the inner space of the chamber to the outside of the chamber.

However, when such cylindrical supporting member is joined with the joining face (back face) of the ceramic heater and the temperature of the heater is elevated, fine cracks may occur along the joining face between the heater and supporting member. Such fine cracks might lead to gas leakage. The assignee filed a Japanese patent application 2000-58, 349 (publication 2001-250, 858A) and disclosed to join a supporting member having a shape of bellows to a ceramic heater to solve the above problems.

SUMMARY OF THE INVENTION

The present inventors have studied to develop a design for reducing the temperature distribution on the surface or heating face of a ceramic susceptor. When a large amount of heat is conducted from the susceptor to the supporting member through its back face, the temperature distribution on the heating face of the susceptor is increased. It is considered effective to reduce the wall thickness of the supporting member for reducing the amount of heat conducted from the susceptor through the supporting member to a chamber. When the susceptor is operated at a high temperature or its temperature is elevated, however, a thermal stress is applied onto the joining portion of the supporting member and susceptor. If the thickness of the supporting member is reduced as described above, the structural strength is reduced. Fine cracks or gas leakage may thereby be easily induced in the joining portion due to the thermal stress applied onto the joining portion. It is thus demanded to provide a novel supporting structure of a ceramic susceptor so that the temperature distribution on the susceptor may be reduced. It is also demanded, in the structure, to prevent the fine cracks or gas leakage in the joining portion, even when the susceptor is operated under severe condition such as a rapid temperature rise from room temperature to a high temperature.

An object of the present invention is, in a supporting structure of a ceramic susceptor, to reduce thermal conduction from a ceramic susceptor to a supporting member, to reduce thermal stress in the joining portion of the susceptor and supporting member, and to prevent fine cracks or gas leakage in the joining portion.

The present invention provides a fixing structure having a ceramic susceptor to be heated and having mounting and back faces, a ceramic supporting member joined with the back face of the susceptor, and a chamber fixing the supporting member. The supporting member has an outer wall surface. A continuous and integral curved part is formed between the outer wall surface and back face and has a radius of curvature "R" of not smaller than 4 mm and not larger than 25 mm in the longitudinal direction of the supporting member. The supporting member has a minimum wall thickness "t" of not smaller than 1 mm and not larger than 15 mm.

The present invention further provides a supporting structure having a ceramic susceptor to be heated and having mounting and back faces, and a ceramic supporting member joined with the back face of the susceptor. The supporting member has an outer wall surface. A continuous and integral curved part is formed between the outer wall surface and back face and has a radius of curvature "R" of not smaller than 4 mm and not larger than 25 mm in the longitudinal direction of the supporting member. The supporting member has a minimum wall thickness "t" of not smaller than 1 mm and not larger than 15 mm.

The present invention further provides a ceramic supporting member to be joined with a ceramic susceptor to be heated. The supporting member has an outer wall surface, a joining face to be joined with the back face of the susceptor and an end face opposite to the joining face. A continuous and integral curved part is formed between the outer wall surface and the joining face, and has a radius of curvature "R" of not smaller than 4 mm and not larger than 25 mm in the longitudinal direction of the supporting member. The supporting member has a minimum wall thickness "t" of not smaller than 1 mm and not larger than 15 mm.

According to the present invention, it is possible to minimize thermal conduction from the susceptor through the supporting member and temperature distribution on the susceptor. Furthermore, a ceramic susceptor may be operated under severe condition, for example, the susceptor is operated at a high temperature or its temperature is rapidly elevated. Even in such case, the present invention may provide a supporting structure so that fine cracks or gas leakage in the joining portion of the susceptor and supporting member may be prevented.

These and other objects, features and advantages of the invention will be appreciated upon reading the following description of the invention when taken in conjunction with the attached drawings, with the understanding that some modifications, variations and changes of the same could be made by the skilled person in the art.

DETAILED DESCRIPTION OF THE INVENTION

The present invention will be described further in detail, referring to the attached drawings.

Figure 1:
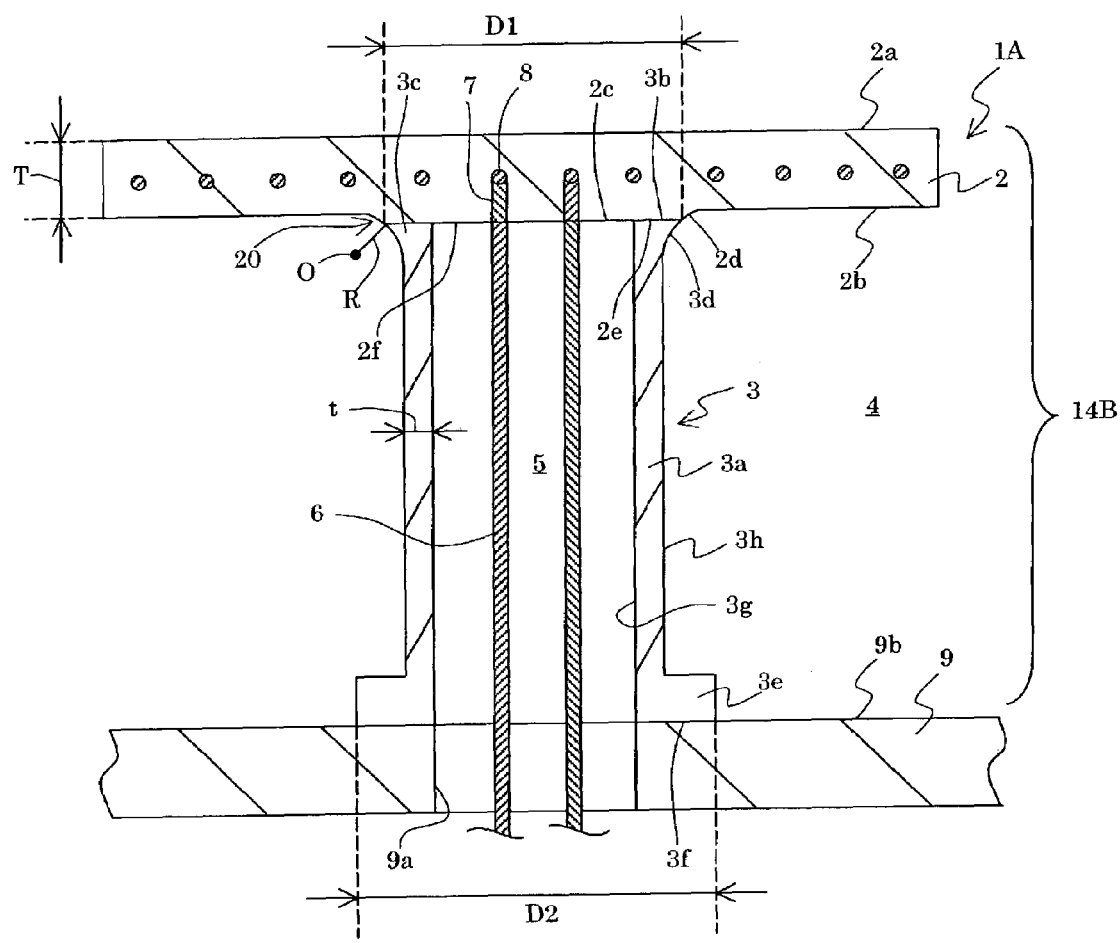
FIG. 1 is a longitudinal sectional view schematically showing a fixing structure according to one embodiment of the present invention.

FIG. 1 is a longitudinal sectional view schematically showing a fixing structure according to one embodiment of the present invention. A supporting structure 14B has a substantially plate-shaped ceramic susceptor 1a, and a supporting member 3 joined with the back face of the susceptor 1A. The susceptor 1A has a substantially plate-shaped substrate 2, a heat resistor 8 embedded in the substrate 2, and terminals 7 connected with the heat resistor 8. The substrate 2 of the susceptor has a flat heating face 2a and a back face 2b opposite to the heating face 2a. A small and disk-shaped ridge or boss 2c is formed on the back face 2b. A curved face 2d is formed around the outer edge of the small ridge 2c. The surfaces 2e and 2f of the ridge 2c are flat.

A supporting member 3 has a straight tube portion 3a having a shape of cylinder, an end portion 3c on the side of the susceptor and a flange portion 3e on the side of a chamber. The supporting member 3 has an inner wall face 3g elongating straightforwardly in the longitudinal direction of the supporting member. A curved face 3d is formed in the end portion 3c of the supporting member 3 at its outer periphery. The supporting member 3 and susceptor 1A are joined with each other at ring shaped joining faces 3b and 2e.

The end face 3f of the flange portion 3e of the supporting member 3 is fixed onto the inner wall surface 9b of a chamber 9. As a result, an opening 9a of the chamber 9 is communicated with an inner space 5 of the supporting member 3, and the inner space 5 is sealed with respect to an inner space 4 of the chamber 9 to secure the air-tightness. Power supply means 6, for example of a shape of a rod, is connected with the terminals 8.

The curved faces 2d and 3d are continuously formed to form an integral curved part 20, between the outer wall surface 3h of the straight tube portion 3a and the back face 2b of the susceptor 2. The radius of curvature "R" of the curved part 20 is adjusted to a value not smaller than 4 mm and not larger than 25 mm according to the present invention, in a longitudinal section of the supporting member 3. Further, the minimum wall thickness "t" of the supporting member 3 is adjusted to a value not smaller than 1 mm and not larger than 15 m. The advantages will be described below.

The supporting member 3 has a wall thickness "t" of not larger than 15 mm, according to the invention. It is thus possible to reduce thermal conduction from the susceptor 1A through the supporting member 3 to the chamber and to prevent local temperature reduction or cold spots on the susceptor 1A. From this viewpoint, "t" is preferably not larger than 10 mm.

On the other hand, the supporting member 3 having a wall thickness "t" that is smaller than 1 mm is susceptible to fracture. Then, "t" is adjusted to a value not smaller than 1 mm in the invention. From the viewpoint of avoiding fracture of the supporting member 3, "t" is preferably not smaller than 1.5 mm.

As described above, the wall thickness "t" of the supporting member 3 is reduced to prevent conduction of heat through the supporting member. It is proved that, in this case, thermal stress in the joining portion of the supporting member 3 and susceptor 1A may be increased to induce fine cracks and gas leakage in the joining portion. For solving the problem, it is effective to provide an integral and continuously formed curved part 20 between the outer wall surface 3h of the supporting member 3 and back face 2b of the susceptor. It is proved that the thermal stress may be reduced considerably by providing a continuous and integral curved part, rather than by providing a plurality of curved parts separate from each other is a stepwise manner.

If the radius of curvature "R" of the curved part 20 is too small, thermal stress applied on the joining face may be increased. It is thus required that the radius of curvature "R" of the curved part is not smaller than 4 mm for reducing the thermal stress. From this viewpoint, the radius of curvature "R" is more preferably not smaller than 7 mm.

It is effective to increase the radius of curvature "R" to further reduce thermal stress in the joining portion of the susceptor and supporting member. If "R" exceeds 20 mm, however, the advantage of reducing thermal stress is not considerable. On the other hand, the following problems are found.

That is, when the radius of curvature "R" is increased, the width "D1" of the joining face 3b of the supporting member 3 is increased as shown in FIG. 1. As "R" is made larger, the width "D1" approaches the width "D2" of the end face 3f of the supporting member 3 and further may exceed "D2". If the width "D1" of the joining face 3b of the supporting member is made larger than the width "D2" of the end face 3f on the opposite side, joining defects may be observed in a part of the joining portion of the susceptor and supporting member. Such joining defects may lead to crack formation in the joining portion, when the susceptor is heated at a high temperature so that a thermal stress is applied on the joining portion. Articles having the joining defects are treated as off-specification products to reduce the overall production yield.

Figure 2:
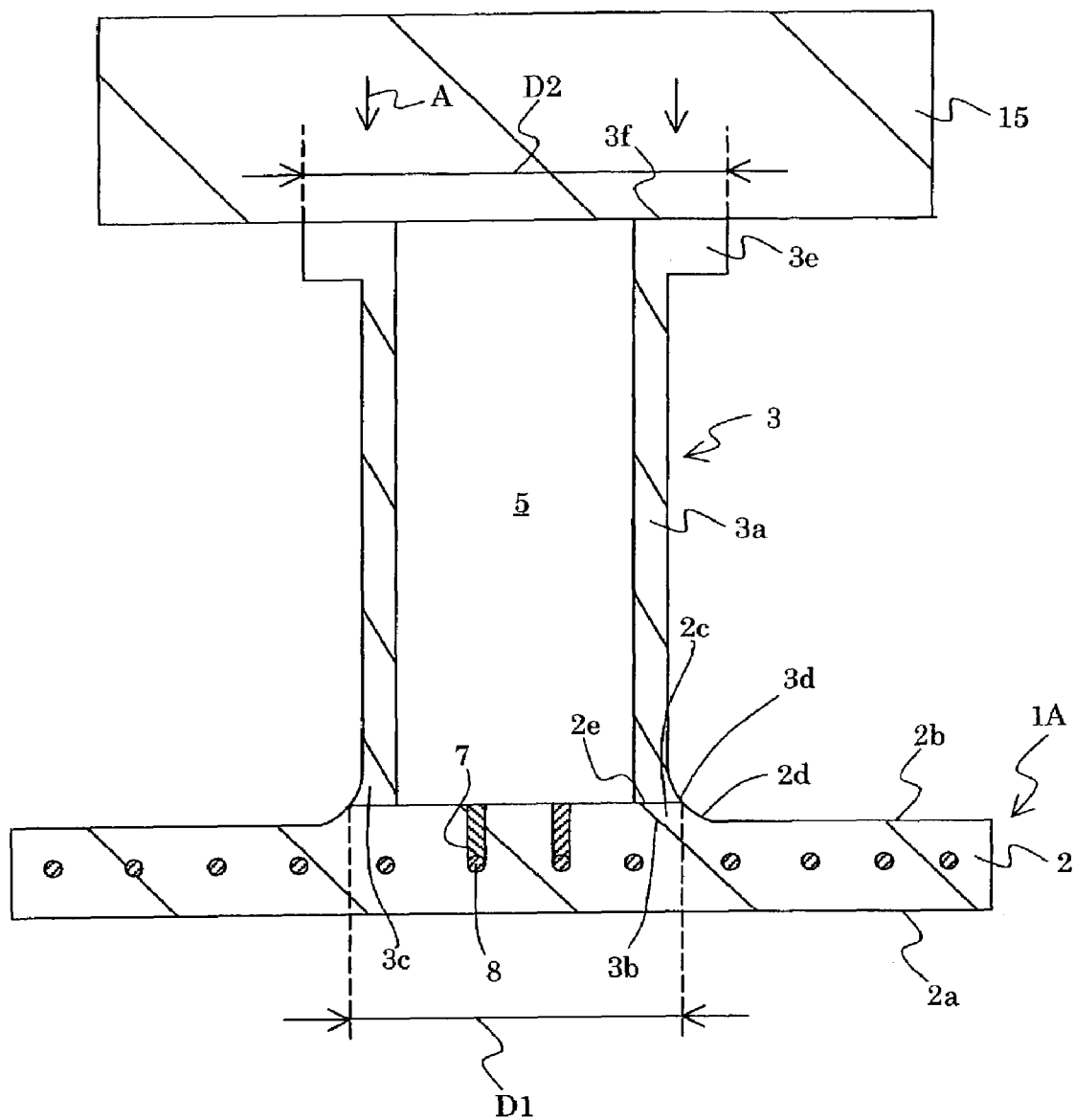
FIG. 2 is a longitudinal sectional view showing a susceptor 1A and supporting member 3 in joining process under pressure.

The reasons may be considered as follows. Although the joining method for joining a ceramic susceptor with a supporting member is not limited, they are generally joined by applying a pressure thereon as shown in FIG. 2. That is, a supporting member 3 is mounted on the back face 2b of the susceptor 1A, the joining face 2e of the substrate 2 is contacted with the joining face 3b of the supporting member 3, and a pressure "A" is applied on the end face 3f of the flange portion 3e. This pressure may be applied by, for example, mounting a weight 15 on the end face 3f.

When the width "D1" of the joining face 3b of the supporting member 3 is smaller than the width "D2" of the end face 3f on the opposite side, a pressure may be uniformly applied on the whole of the joining face 3b with ease. When "D1" is larger than "D2", however, it is difficult to apply a sufficient pressure on a part of the joining face 3b so that the part remains as joining defects. Such defects may be starting points of the fracture when thermal stress is induced in the joining portion.

From this viewpoint, "D1" is preferably smaller. To reduce "D1," it has been shown that the radius of curvature "R" of the curved part is preferably not larger than 25 mm, and more preferably, not larger than 15 mm.

In the present invention, the minimum thickness of the supporting member is not smaller than 1 mm and not larger than 15 mm. Preferably, the supporting member has a cylindrical straight tube portion 3a. In this case, the thickness of the tube portion 3a is the minimum wall thickness of the supporting member.

In a preferred embodiment, the width "D1" of the joining face of the supporting member at its outer profile to the susceptor is made smaller than the width "D2" of the end face of the supporting member, opposite to the joining face, at its outer profile. "D1" and "D2" are the widths of the joining and end faces at their outer profiles, respectively. In FIG. 1, the joining face 3b is ring-shaped, and the distance of the inner and outer profiles of the joining face might also be defined as a width of the joining face. However, "D1" in the present invention is a width of the joining face 3b at its outer profile and not the distance of the outer and inner profiles. Further, the width of the joining face or end face may be defined as a length of an ideal diagonal line in the joining or end face at its outer profile. When the outer profile of the joining or end face is circular, the width "D1" or "D2" is a diameter of the outer profile. When the outer profile of the joining or end face is elliptical, the width "D1" or "D2" is a length of the major axis. When the outer profile of the joining or end face is polygonal, the width "D1" or "D2" is a maximum of lengths of the diagonal lines drawn in the polygonal shape.

In a preferred embodiment, a ratio of "D1" to "D2" (D1/D2) is not larger than 1, and more preferably not larger than 0.9. Further in a preferred embodiment, the difference between D1 and D2 (D2−D1) is not smaller than 0 mm and more preferably not smaller than 3 mm.

On the other hand, as "D1" is made too small, the radius of curvature "R" of the curved part tends to be smaller so that the thermal stress in the joining portion of the susceptor and supporting member may be increased. For reducing the thermal stress, (D1/D2) is preferably not smaller than 0.3 and more preferably, not smaller than 0.5. Further, (D2−D1) is preferably not larger than 40 mm, and more preferably, not larger than 30 mm.

The thickness "T" of the ceramic susceptor is preferably not larger than 50 mm for reducing thermal stress in the joining portion of the susceptor and supporting member. The thickness "T" is preferably not smaller than 3 mm for providing the mechanical strength needed for proper handling to the susceptor.

Figure 3:
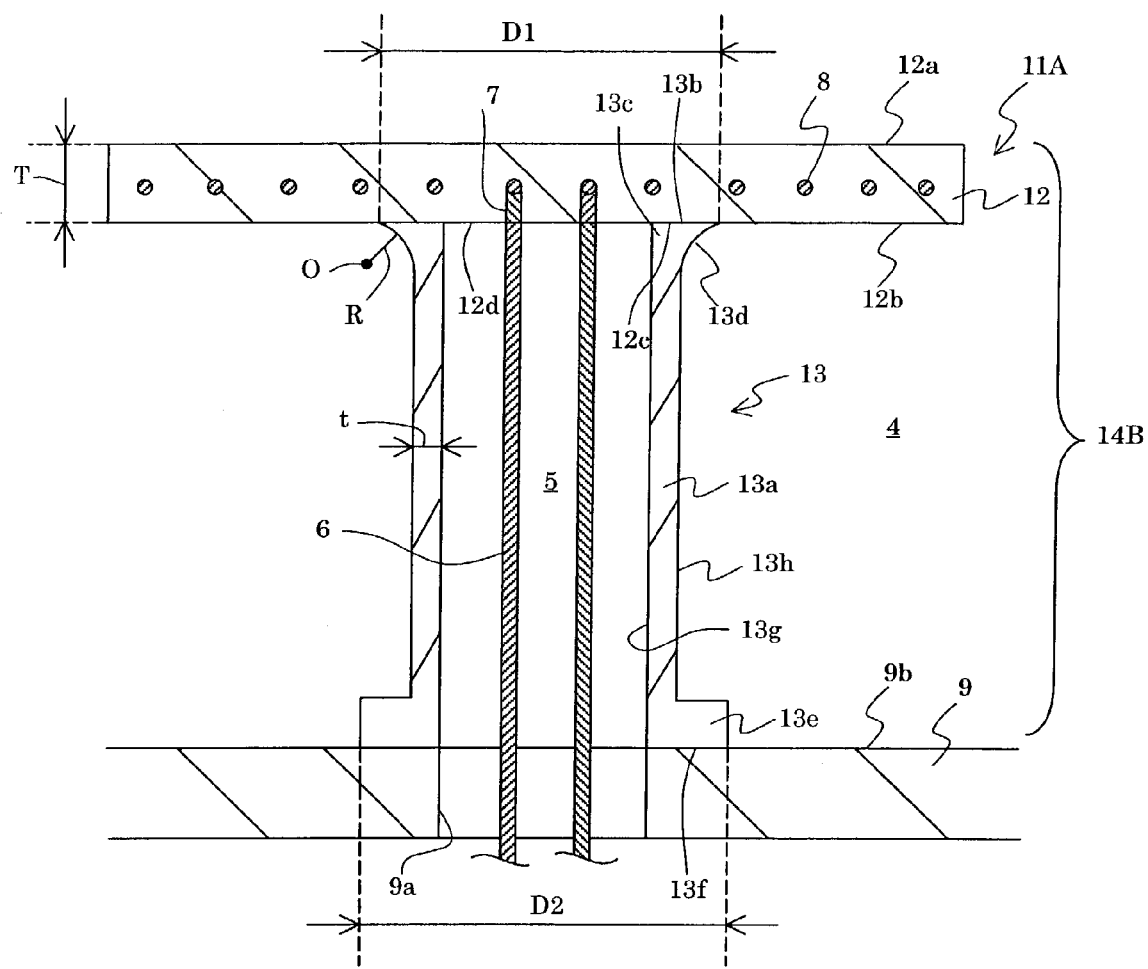
FIG. 3 is a longitudinal sectional view schematically showing a fixing structure according to another embodiment of the present invention.

FIG. 3 is a longitudinal sectional view schematically showing a fixing and supporting structures of a susceptor, according to another embodiment of the present invention. In FIG. 3, parts and dimensions already shown in FIGS. 1 and 2 are indicated by the same numerals and their explanation may be omitted.

The supporting structure 14B shown in FIG. 3 has a substantially plate-shaped susceptor 11A and a supporting member 13 joined with the back face of the susceptor 11A. The susceptor 11A has a substantially plate-shaped substrate 12, a heat resistor 8 embedded in the substrate 12 and terminals connected with the heat resistor 8. The substrate 12 has a flat heating face 12a, and a back face 12b opposite to the heating face 12a. In the present embodiment, the small ridge 2c (refer to FIG. 1) is not formed on the side of the back face 12b.

The supporting member 13 has a straight tube portion 13a having a shape of a cylinder, an end portion 13c on the side of the susceptor, and a flange portion 13e on the side of a chamber. The supporting member 13 has an inner wall surface 13g extending straightforwardly in the longitudinal direction of the supporting member. A curved part 13d is provided in the end portion 13c at its outer periphery. The supporting member 13 and susceptor 11A are joined with each other at ring-shaped joining faces 13b and 12c. 12d represents an exposed face to the inner space 5. The flange portion 13e of the supporting member 13 has an end face 13f fixed onto the inner wall surface 9b of the chamber 9.

An integral and continuously formed curved part 13d is provided between the outer wall surface 13h of the supporting member 13 and the back face 12c of the susceptor 12. The radius of curvature "R" of the curved part 13d is not smaller than 4 mm and not larger than 25 mm according to the present invention, in a longitudinal section of the supporting member 13.

An integral curved part is continuously formed between the outer wall surface of the supporting member and the back face of the susceptor and its radius of curvature is defined according to the present invention. In the present invention, one curved face may be provided as the integral and continuously formed curved part. One curved face is defined as a curved face having a common center of curvature and radius of curvature, in the longitudinal section. Alternatively, a plurality of curved faces may be provided continuously to form an integral curved part. In other words, the curved part includes a plurality of curved faces in which at least one of the center of curvature and radius of curvature is different from each other. The plurality of curved faces are continuously formed.

The present invention does not include cases where a plurality of curved faces and a flat face, a groove or a ridge are formed in the curved part and where the adjacent curved faces are divided by the flat face, groove or ridge.

The present invention, however, does include the case where a plurality of curved faces are formed in a curved part, as long as the curved faces are continuously formed to provide an integral curved part as a whole. For example, a plurality of curved faces having a common center of curvature and different radii of curvature may be continuously formed. Alternatively, a plurality of curved faces having different centers of curvature and a common radius of curvature may be continuously formed. Further, a plurality of curved faces having different centers of curvature and different radii of curvature may be continuously formed.

Figure 4:
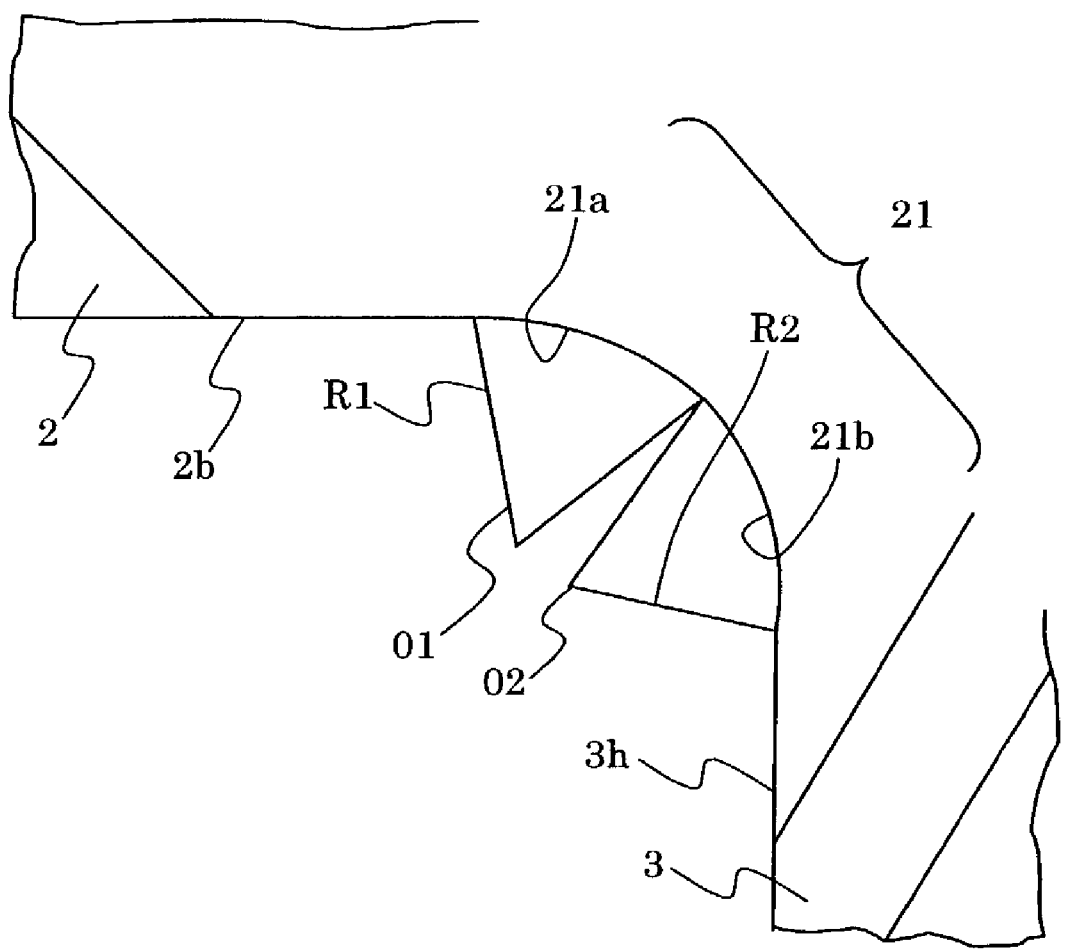
FIG. 4 is a diagram schematically showing the shape of a curved part in the joining portion of a susceptor and supporting member.

For example, in an embodiment schematically shown in FIG. 4, a curved part 21 is composed of curved faces 21a and 21b which are continuously formed. The curved face 21a has a center "O1" of curvature and radius "R1" of curvature. The curved face 21b has a center "O2" of curvature and radius "R2" of curvature.

When a plurality of curved faces having different centers of curvature are continuously formed, the distance between the different centers of curvature is preferably not larger than 10 mm, and more preferably, not larger than 5 mm. When a plurality of curved faces having different radii of curvature are continuously formed, the difference between the different radii of curvature is preferably not larger than 10 mm, and more preferably, not larger than 5 mm.

The materials of the susceptor may be selected depending on the use and are not particularly limited. The material is preferably a ceramic having corrosion resistance against halogen-series corrosive gases, such as aluminum nitride or dense alumina. Aluminum nitride ceramics or alumina having a relative density of not less than 95% is particularly preferred. A functional part such as a heat resistor, an electrode for electrostatic chuck or an electrode for generating plasma may be embedded or provided in the susceptor.

The susceptor may be heated by a heating source that is not limited. The susceptor includes susceptors heated by an outer heat source (for example infrared lamp) and an inner heat source (for example, a heating element embedded in the susceptor). The shape of the ceramic constituting the supporting member is not limited and may be, for example, an elongate body made of a plate-shaped ceramic material. The shape is preferably a tube.

The material for the supporting member is not particularly limited. The material is preferably a ceramic having corrosion resistance against a halogen-series corrosive gas, and more preferably, aluminum nitride or dense alumina.

The method of joining the susceptor and supporting member is not limited and includes solid phase welding, solid-liquid-phase welding, soldering and mechanical fixing such as screwing. The solid-liquid phase welding is described in U.S. Pat. No. 6,261,708 (Japanese patent publication 273, 370A/1998).

In a preferred embodiment, the susceptor and supporting member are joined with solid phase welding. In solid phase welding, liquid containing a sintering aid is applied on the joining face. The sintering aid is effective to at least one ceramic constituting the susceptor and that constituting the supporting member. The susceptor and supporting member are laminated to obtain a laminated body. Pressure is applied on the laminated body in a direction that is perpendicular to the joining face while the laminated body is heated at a temperature that is slightly lower than the sintering temperature. Particularly preferably, solid phase welding is performed as follows.

(1) A precursor compound having an aluminum-nitrogen bond for aluminum nitride is made present between the joining face of the supporting member and the back face of the susceptor and decomposed to join them. Preferably in this case, the supporting member and susceptor are made of aluminum nitride ceramics.

The precursor compound includes organic and inorganic compounds having an aluminum-nitrogen bond. The organic compound includes an addition product of $R_3Al$ and ammonia or ethylene diamine (R represents methyl, ethyl, propyl or butyl group), a condensation product of $AlH_3$ and $NH_3$, and polyalkyl imino alum [(HAlNR)n]. Polyalkyl imino alum is a polymer of alkyl imino alum (HAlNR: R represents an alkyl group) and has so-called basket type structure. For producing this, a hydrochloride of aluminum is reacted with an amine or a hydride of an amine. When "R" represents ethyl group, an octamer [$(HAlNR)_8$: "R" represents ethyl group)] is mainly produced. When "R" represents isopropyl group, a hexamer [$(HAlNR)_6$: "R" represents isopropyl group)] is mainly produced. When "R" represents methyl group, insoluble polymer may be easily generated.

The decomposition temperature of the precursor compound having aluminum-nitrogen bond may preferably be not higher than 1600° C. The joining process may preferably be performed in an atmosphere of an inert gas such as argon or the like and a reducing atmosphere such as ammonia-nitrogen or the like. It is preferred to use an atmosphere of ammonia—as an inert gas for removing carbon generated from the precursor compound having an aluminum-nitrogen bond during the decomposition of the compound.

It is preferred to apply a pressure in the direction perpendicular to each of the joining faces for further improving the joining strength. The effects of applying a pressure may be observed substantially at a pressure of 0.1 kg/cm$^2$. The pressure is preferably not higher than 500 kg/cm$^2$.

A compound having silicon-nitrogen bond may be used in addition to the precursor compound having aluminum-nitrogen bond.

(2) A solution containing a sintering aid is provided between the joining face of the supporting member and the back face of the susceptor and then heat treated. The sintering aid is effective to at least one ceramic constituting the susceptor and that constituting the supporting member. For example, when the ceramic is aluminum nitride or silicon nitride, the sintering aid may preferably one or more compound selected from the group consisting of compounds of yttrium, ytterbium and an alkaline earth metal. A compound of yttrium is most preferred.

A sintering aid such as a chloride, sulfate, phosphate, nitrate and carbonate are easily wettable and handled. For example, an aqueous solution of yttrium chloride, a hydrate of yttrium chloride, yttrium sulfate, yttrium acetate are preferred.

The joining process may be performed by a heat treatment at ambient temperature, hot pressing, plasma activated sintering or local heating method with laser radiation.

EXAMPLES (Experiment A)

A fixing structure shown in FIG. 1 was produced. As a susceptor 1A, a disk of aluminum nitride sintered body having a diameter φ of 300 mm and a thickness of 10 mm was used. The supporting member 3 was formed of a ceramic plate. The length of the supporting member 3 was 70 mm. The supporting member 3 and susceptor 1A were set as shown in FIG. 2 by means of solid phase welding under the following condition.

Pressure of atmosphere in a furnace: 0.5 kg/cm$^2$G

Maximum temperature: 2000° C.

Holding time at a maximum temperature: 60 minutes

Pressure during the joining process: 0.5 to 1.0 kg/cm$^2$

Joining material: solution containing yttrium and acetic acid as main components The supporting member 3 and chamber 9 were fixed by screws. The supporting member 3 and chamber 9 were sealed with an O-ring made of fluorine rubber.

Figure 5:
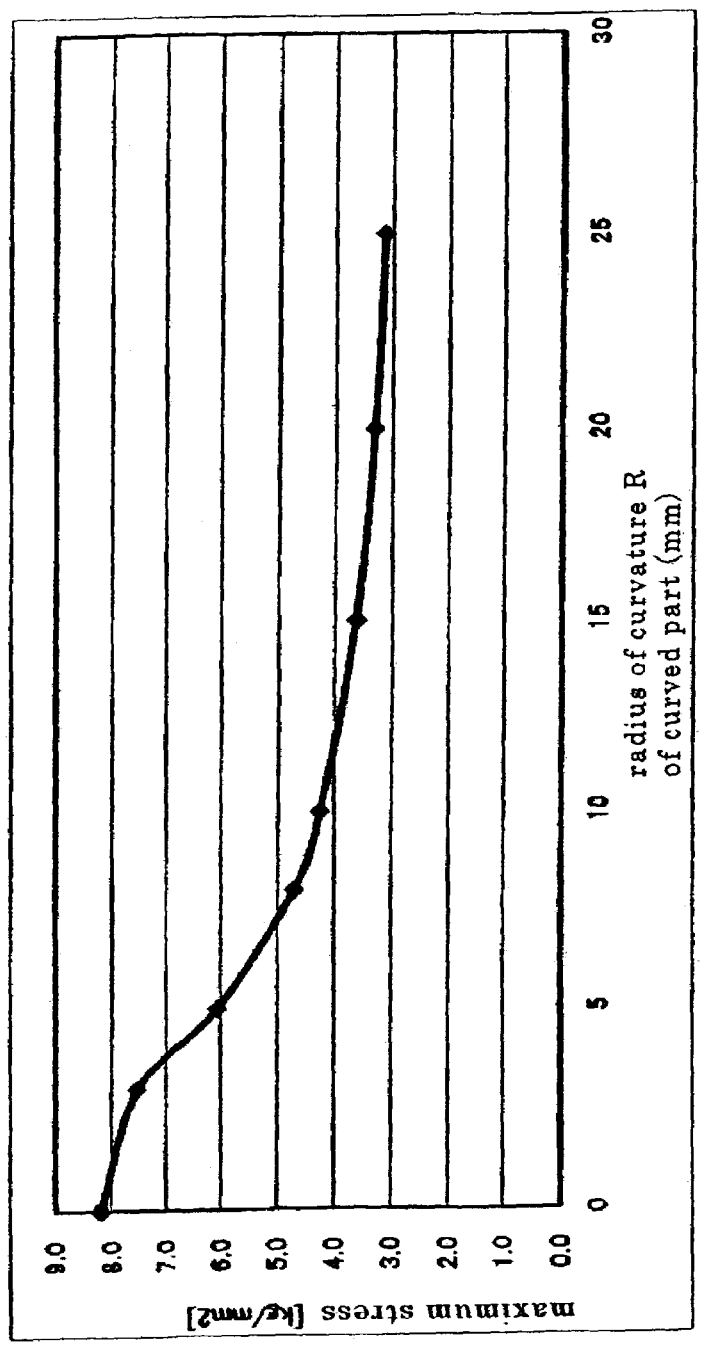
FIG. 5 is a graph showing relationship of a radius of curvature "R" of the curved part and maximum stress in the supporting member.

Simulation was performed at this stage under the provision that the heating face 2a of the susceptor 1A was heated to a temperature of about 600° C. and the temperature at the joining portion of the chamber 9 and supporting member 3 was maintained at about 150° C. "D1" was set to be 40 mm, "D2" 50 mm, "t" 2.5 mm and "T" 10 mm. The radius of curvature "R" was changed as shown in FIG. 5 and inner stress in the supporting member 3 was calculated over the whole of the supporting member, so that the maximum stress was obtained. The relationship between "R" and maximum stress was shown in FIG. 5.

As can be seen from the results, it is effective to increase "R" to a value not smaller than 4.0 mm for reducing the maximum stress in the supporting member 3. "R" is more preferably not smaller than 7 mm for further reducing the maximum stress in the supporting member 3. When "R" is larger than 20 mm, an increase of "R" does not substantially contribute to the reduction of the maximum stress.

Particularly, under the above conditions, the maximum stress of not larger than 6.0 kg/mm$^2$ have not been realized until now. The inventive structure can realize such extremely small maximum stress, which have not been realized, by means of relatively simple design as shown in FIG. 1. The invention is thus useful in the technical field.

(Experiment "B")

Figure 6:
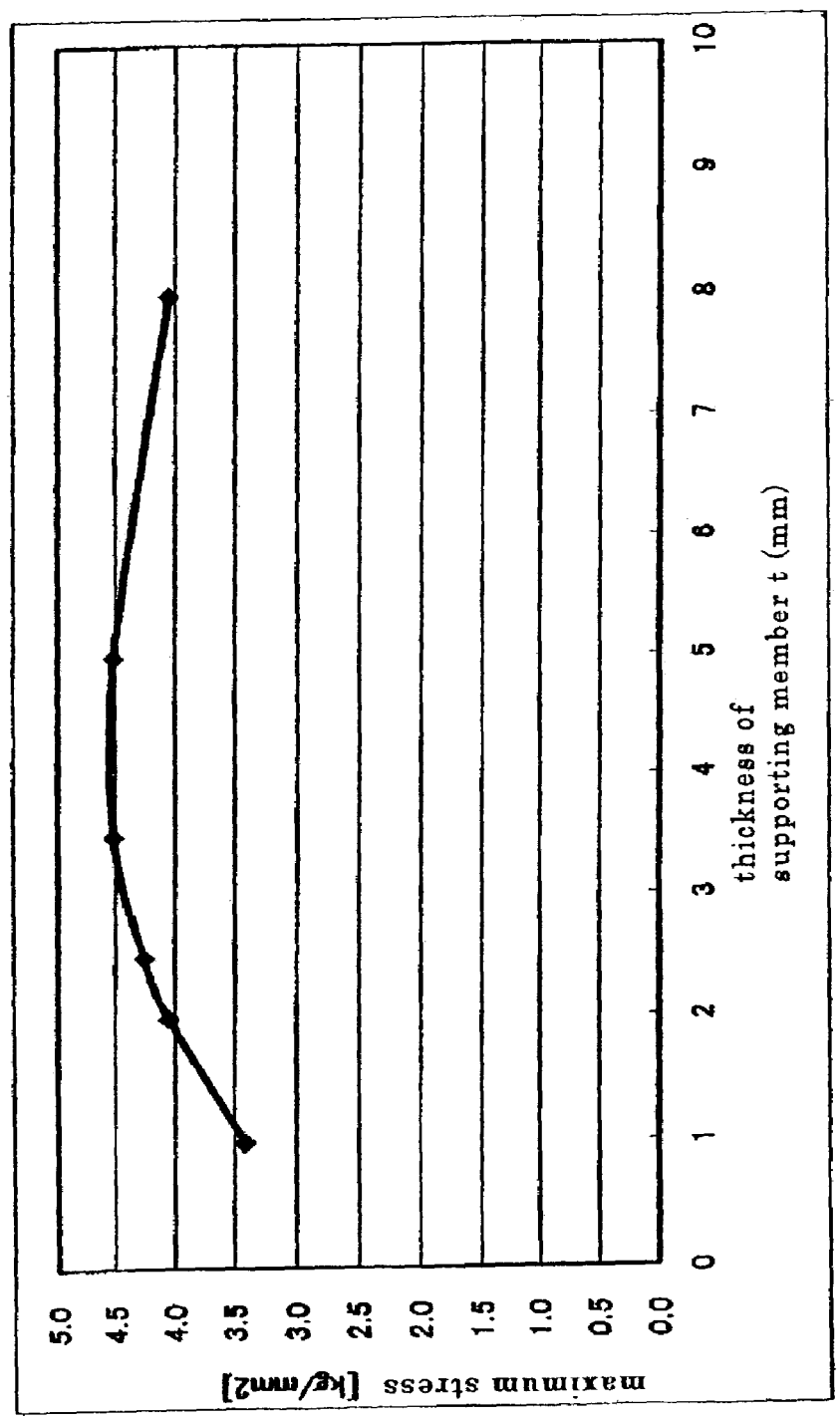
FIG. 6 is a graph showing relationship of a wall thickness "t" of the supporting member and maximum stress in the supporting member.

The simulation of maximum stress in the supporting member was performed according to the same process as Experiment A, except for the following conditions. That is, "D1" was set as 40 mm, "D2" 50 mm, "T" 10 mm, and "R" 10 mm. The wall thickness "t" of the supporting member 3 was changed as shown in FIG. 6, and inner stress in the supporting member 3 was calculated over the whole of the supporting member, so that the maximum stress was obtained. The relationship between "t" and maximum stress was shown in FIG. 6.

As a result, when the wall thickness "t" is not smaller than 5 mm, it was proved that the maximum stress gradually reduced. From the viewpoint of reducing the maximum stress, the wall thickness "t" of not larger than 15 mm is sufficient. However, the wall thickness "t" is preferably not larger than 3 mm or not smaller than 6 mm for further reducing the maximum stress. When the wall thickness "t" is smaller than 1 mm, a mechanical stress might lead to fracture of the supporting member.

(Experiment "C")

The supporting structure 14A shown in FIG. 1 was produced according to the same procedure described in Experiment A. However, "D1" was set at 40 mm, "D2" 50 mm, "t" 2.5 mm, "T" 10 mm and "R" 10 mm.

The temperature on the heating face was reduced from 600° C. to room temperature. After that, the presence of fracture on the appearances of the susceptor and supporting member was observed and not fracture was found. Further, the presence of fine cracks was measured, by fluorescence crack detection, in the joining portion of the susceptor and supporting member. Consequently, no fine cracks were observed.

As described above, the inventive structure can realize rapid temperature rise to a high temperature, for example of 600° C., by means of relatively simple structure.

As described above, according to the supporting structure of the present invention, it is possible to reduce thermal conduction from a ceramic susceptor to a supporting member, to reduce thermal stress in the joining portion of the susceptor and supporting member and to prevent fine cracks or gas leakage.

The present invention has been explained referring to the preferred embodiments. However, the present invention is not limited to the illustrated embodiments which are given by way of examples only, and may be carried out in various modes without departing from the scope of the invention.

What is claimed is:

1. A fixing structure of a ceramic susceptor, said fixing structure comprising:
   a ceramic susceptor to be heated, said ceramic susceptor having a mounting face and a back face;
   a ceramic supporting member joined with said back face of said susceptor, and a chamber wall fixing said supporting member;
   wherein said ceramic supporting member has an outer wall surface and a continuous and integral curved part formed between said outer wall surface and said back face of said susceptor that is concave with respect to said outer wall surface of said ceramic supporting member;
   wherein said curved part has a radius of curvature R in a range of 4 mm to 25 mm in the longitudinal direction of said ceramic supporting member, and a center of curvature of said curved part is located outside said outer wall surface of said ceramic supporting member; and
   wherein said ceramic supporting member has a wall thickness t in a range of 1 mm to 15 mm.

2. The fixing structure of claim 1, wherein said ceramic susceptor has a thickness T in a range of 3 mm to 50 mm.

3. The fixing structure of claim 1, wherein said supporting member further comprises a joining face joined with said ceramic susceptor and an end face opposing said joining face, and wherein a width D1 of said joining face at an outer profile thereof is less than a width D2 of said end face at an outer profile thereof.

4. The fixing structure of claim 1, wherein said ceramic susceptor is joined with said ceramic supporting member by means of solid phase welding.

5. The fixing structure of claim 1, wherein said ceramic supporting member is joined directly to said back face of said susceptor.

6. A supporting structure of a ceramic susceptor, said supporting structure comprising:
   a ceramic susceptor to be heated, said ceramic susceptor having a mounting face and a back face; and
   a ceramic supporting member joined with said back face of said susceptor;
   wherein said ceramic supporting member has an outer wall surface and a continuous and an integral curved part formed between said outer wall surface and said back face that is concave with respect to said outer wall surface;
   wherein said curved part has a radius of curvature R in a range of 4 mm to 25 mm in the longitudinal direction of said ceramic supporting member and a center of curvature of said curved part is located outside said outer wall surface of said ceramic supporting member; and
   wherein said ceramic supporting member has a wall thickness t in a range of 1 mm to 15 mm.

7. The supporting structure of claim 6, wherein said ceramic susceptor has a thickness T in a range of 3 mm to 50 mm.

8. The supporting structure of claim 6, wherein said ceramic supporting member further comprises a joining face joined with said ceramic susceptor and an end face opposing said joining face, and wherein a width D1 of said joining face at an outer profile thereof is less than a width D2 of said end face at an outer profile thereof.

9. The supporting structure of claim 6, wherein said ceramic susceptor is joined with said ceramic supporting member by means of solid phase welding.

10. The supporting structure of claim 6, wherein said ceramic supporting member is joined directly to said back face of said susceptor.

11. A ceramic supporting member to be joined with a ceramic susceptor to be heated, said ceramic susceptor having a mounting face and a back face;
   wherein said ceramic supporting member comprises an outer wall surface, a joining face to be joined with said back face of said susceptor and an end face opposing said joining face;
   wherein a continuous and integral curved part formed between said outer wall surface and said joining face is concave with respect to said outer wall surface of said ceramic supporting member, said curved part having a radius of curvature R in a range of 4 mm to 25 mm in the longitudinal direction of said ceramic supporting member and a center of curvature that is located outside said outer wall surface; and
   wherein said ceramic supporting member has a wall thickness t in a range of 1 mm to 15 mm.

12. The ceramic supporting member of claim 11, wherein a width D1 of said joining face at an outer profile thereof is less than a width D2 of said end face at an outer profile thereof.

13. The ceramic supporting member of claim 11, wherein said ceramic supporting member is joined directly to said back face of said susceptor.

* * * * *